(12) United States Patent
Lee et al.

(10) Patent No.: US 10,437,374 B2
(45) Date of Patent: Oct. 8, 2019

(54) DISPLAY DEVICE

(71) Applicant: Samsung Display Co., Ltd., Yongin-si (KR)

(72) Inventors: Taehee Lee, Hwaseong-si (KR); Wonki Hong, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 2 days.

(21) Appl. No.: 15/877,652

(22) Filed: Jan. 23, 2018

(65) Prior Publication Data

US 2018/0210602 A1    Jul. 26, 2018

(30) Foreign Application Priority Data

Jan. 25, 2017 (KR) .................. 10-2017-0012292

(51) Int. Cl.

| | |
|---|---|
| *G06F 3/041* | (2006.01) |
| *H05K 5/02* | (2006.01) |
| *H05K 5/03* | (2006.01) |
| *H05K 5/00* | (2006.01) |
| *H04M 1/02* | (2006.01) |

(52) U.S. Cl.
CPC ............ *G06F 3/0414* (2013.01); *G06F 3/041* (2013.01); *H04M 1/026* (2013.01); *H04M 1/0268* (2013.01); *H05K 5/0017* (2013.01); *H05K 5/0217* (2013.01); *H05K 5/03* (2013.01); *G06F 2203/04102* (2013.01)

(58) Field of Classification Search
CPC ..... H04M 1/026; H04M 1/0268; G06F 3/041; G06F 3/0414; G06F 2203/04102; H05K 5/0017; H05K 5/0217; H05K 5/03
See application file for complete search history.

(56) References Cited

U.S. PATENT DOCUMENTS

| | | | |
|---|---|---|---|
| 8,723,813 B2 | 5/2014 | Park et al. | |
| 9,796,147 B2* | 10/2017 | Cheo | ............ B29D 11/0073 |
| 2007/0229475 A1* | 10/2007 | Gettemy | ............ G06F 1/1626 |
| | | | 345/173 |
| 2013/0155627 A1 | 6/2013 | Mareno et al. | |
| 2014/0104762 A1* | 4/2014 | Park | ............ G06F 1/1652 |
| | | | 361/679.01 |

(Continued)

FOREIGN PATENT DOCUMENTS

| | | |
|---|---|---|
| KR | 10-0975868 | 8/2010 |
| KR | 10-2014-0073098 | 6/2014 |
| KR | 10-1675274 | 11/2016 |

*Primary Examiner* — Liliana Cerullo
(74) *Attorney, Agent, or Firm* — H.C. Park & Associates, PLC

(57) ABSTRACT

A display device including a bottom cover, a window disposed on the bottom cover, a frame disposed between the bottom cover and the window, a display panel disposed between the frame and the window, a bracket disposed between the display panel and the frame, and a pressure sensing portion disposed between the bracket and the display panel, in which the frame includes a base portion disposed between the bottom cover and the bracket, a first support portion protruding from an edge of the base portion toward an edge of the window, and a second support portion protruding from the first support portion, disposed between an edge of the bracket and the base portion, and spaced apart from the base portion.

14 Claims, 8 Drawing Sheets

(56) References Cited

U.S. PATENT DOCUMENTS

2015/0296062 A1* 10/2015 Lee .................. G02F 1/133345
                                                     455/566
2016/0066440 A1*  3/2016 Choi .................... G06F 1/1637
                                                     361/679.3

* cited by examiner

DISPLAY DEVICE

CROSS-REFERENCE TO RELATED APPLICATION

This application claims priority from and the benefit of Korean Patent Application No. 10-2017-0012292, filed on Jan. 25, 2017, which is hereby incorporated by reference for all purposes as if fully set forth herein.

BACKGROUND

Field

Exemplary implementations of the invention relate generally to a display device, and more particularly, to a display device capable of substantially reducing sensitivity deviation in a pressure sensing portion.

Discussion of the Background

Flat panel display (FPD) devices have reduced weight and size than cathode ray tube (CRT) devices. Such FPD devices may include liquid crystal display (LCD) devices, field emission display (FED) devices, plasma display panel (PDP) devices, and organic light emitting diode (OLED) display devices.

Among the FPD devices, the OLED display device displays images using an OLED that generates light from recombination of electrons and holes.

The above information disclosed in this Background section is only for understanding of the background of the inventive concepts, and, therefore, it may contain information that does not constitute prior art.

SUMMARY

A display device constructed according to exemplary implementations of the invention is capable of substantially reducing a sensitivity deviation of a pressure sensing portion.

According to an exemplary embodiment, a display device includes a bottom cover, a window disposed on the bottom cover, a frame disposed between the bottom cover and the window, a display panel disposed between the frame and the window, a bracket disposed between the display panel and the frame, and a pressure sensing portion disposed between the bracket and the display panel, in which the frame includes a base portion disposed between the bottom cover and the bracket, a first support portion protruding from an edge of the base portion toward an edge of the window, and a second support portion protruding from the first support portion, disposed between an edge of the bracket and the base portion, and spaced apart from the base portion.

The frame may further include a protrusion portion protruding from the second support portion toward the base portion.

The first support portion may include at least one inclined surface, and the second support portion may protrude from the inclined surface of the first support portion.

The inclined surface may be adjacent to a surface of the base portion facing the bracket.

An angle between the inclined surface and the surface of the base portion may be an obtuse angle.

An angle between the first support portion and the second support portion may be equal to or less than a right angle.

The frame may further include a third support portion protruding from an edge of the base portion toward an edge of the bottom cover, and a fourth support portion protruding from the third support portion, disposed between the base portion and the bottom cover, and spaced apart from the base portion.

The edge of the base portion from which the third support portion protrudes may face the edge of the base portion from which the first support portion protrudes.

The third support portion may include at least one inclined surface, and the fourth support portion may protrude from the inclined surface of the third support portion.

The inclined surface may be adjacent to a surface of the base portion facing the bottom cover.

An angle between the inclined surface and the surface of the base portion may be an obtuse angle.

An angle between the third support portion and the fourth support portion may be equal to or less than a right angle.

At least one of the bottom cover, the window, the pressure sensing portion, the display panel, and the bracket may have a curved edge.

The display device may further include at least one of a first tape disposed between the edge of the bottom cover and the first of the frame, and a second tape disposed between the first support portion and the window, between the first support portion and the display panel, between the first support portion and the pressure sensing portion, and between the second support portion and the bracket.

According to an exemplary embodiment, a display device includes a bottom cover, a window disposed on the bottom cover, a frame disposed between the bottom cover and the window, a display panel disposed between the frame and the window, and a pressure sensing portion disposed between the display panel and the frame. The frame includes a first support portion disposed between a central portion of the bottom cover and a central portion of the pressure sensing portion, a second support portion disposed between an edge of the bottom cover and an edge of the pressure sensing portion, and a connection portion spaced apart from the pressure sensing portion and disposed between the first support portion and the second support portion, in which a hole surrounded by the first support portion, the second support portion, the connection portion, and the pressure sensing portion is located corresponding to an intermediate portion between the edge of the pressure sensing portion and the central portion of the pressure sensing portion.

The first support portion may include a support plate disposed closer to the pressure sensing portion than to the bottom cover, and a column disposed between the support plate and the bottom cover.

The support plate may contact the central portion of the pressure sensing portion.

The column may be disposed at an edge of the support plate.

Additional features of the inventive concepts will be set forth in the description which follows, and in part will be apparent from the description, or may be learned by practice of the inventive concepts.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
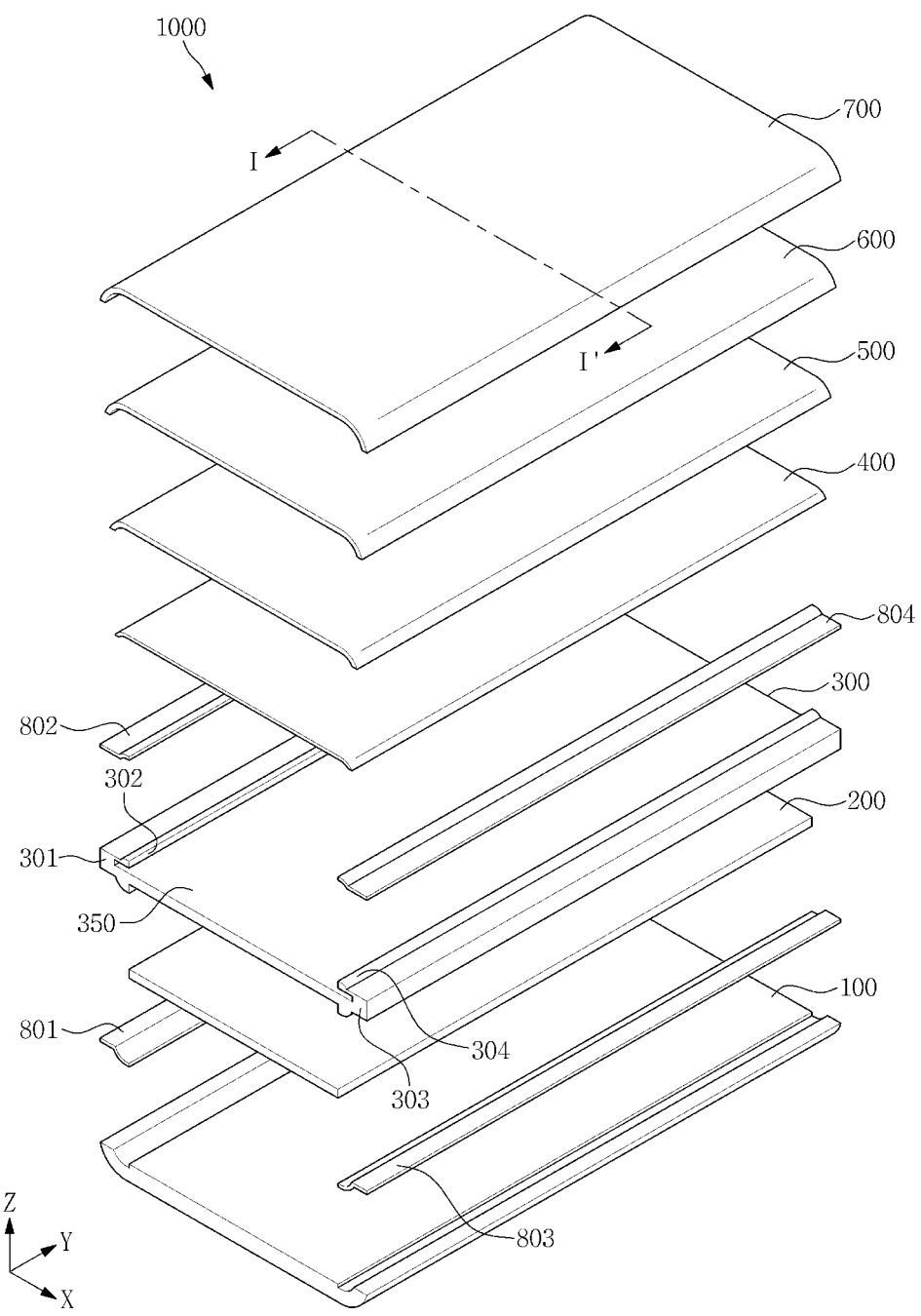
FIG. 1 is an exploded perspective view illustrating a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Hereinafter, a display device constructed according to the principles of the invention will be described in detail with reference to FIGS. 1 to 11.

Figure 2:
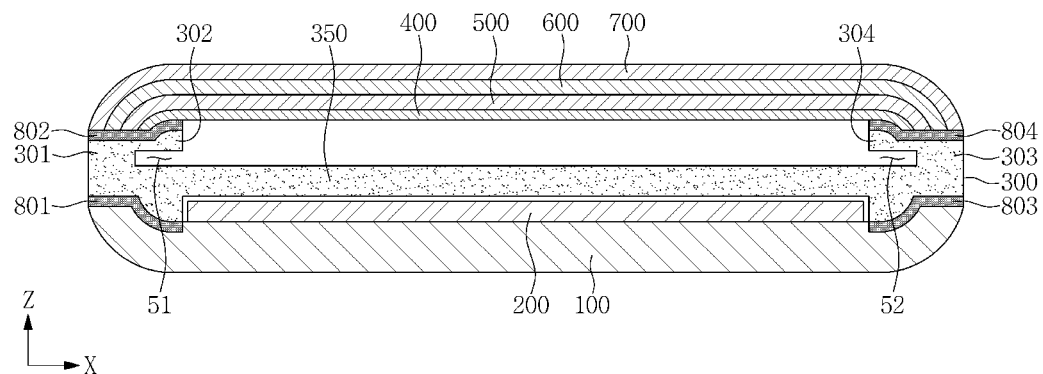
FIG. 2 is a cross-sectional view taken along line I-I' of FIG. 1 according to an exemplary embodiment.

FIG. 1 is an exploded perspective view illustrating a display device according to an exemplary embodiment, and FIG. 2 is a cross-sectional view taken along line I-I' of FIG. 1.

As illustrated in FIGS. 1 and 2, a display device according to an exemplary embodiment includes a bottom cover 100, a circuit board 200, a frame 300, a bracket 400, a pressure sensing portion 500, a display panel 600, and a window 700.

The bottom cover 100 may include curved portions at opposite edges thereof. More particularly, opposing edges of the bottom cover 100 that face each other may have a curved shape. A portion between the curved opposing edges of the bottom cover 100 (hereinafter, a central portion) may be flat.

The circuit board 200 is disposed on the bottom cover 100. For example, the circuit board 200 is disposed on an inner side surface of the bottom cover 100. When surfaces of the bottom cover 100 and the window 700 that face each other are defined as inner side surfaces, the circuit board 200 is disposed on the inner side surface of the bottom cover 100. More particularly, the circuit board 200 is disposed at the central portion of the inner side surface of the bottom cover 100.

Various driving circuits may be located at the circuit board 200 to drive the display panel 600. The driving circuits may include, for example, a timing controller, a power supply, a touch controller, and the like.

The frame 300 is disposed between the bottom cover 100 and the window 700. The frame 300 may be disposed on the bottom cover 100. For example, the frame 300 may be disposed on the inner side surface of the bottom cover 100. As described above, the circuit board 200 is disposed between the frame 300 and the bottom cover 100.

Opposite edges of the frame 300 facing each other are disposed on the opposite edges of the bottom cover 100, respectively. In other words, one side edge of the frame 300 is disposed on one side edge (e.g., one side curved portion) of the bottom cover 100, and the other side edge of the frame 300 is disposed on the other side edge (e.g., another side curved portion) of the bottom cover 100.

The frame 300 may include a base portion 350, a first support portion 301, a second support portion 302, a third support portion 303, and a fourth support portion 304.

The base portion 350 of the frame 300 is disposed between the bottom cover 100 and the bracket 400. One side edge of the base portion 350 is disposed on one side edge (e.g., one side curved portion) of the bottom cover 100, and the other side edge of the base portion 350 is disposed on the other side edge (e.g., another side curved portion) of the bottom cover 100. A central portion of the base portion 350 is disposed between the opposite side edges of the base portion 350, and the central portion of the base portion 350 may overlap the central portion of the bottom cover 100 and the bracket 400. For example, the central portion of the base portion 350 may be disposed between a central portion of the circuit board 200 and a central portion of the bracket 400.

The first support portion 301 of the frame 300 protrudes from the base portion 350. For example, the first support portion 301 protrudes from one side edge of the base portion 350. More particularly, the first support portion 301 may protrude vertically from one side edge of the base portion 350 in a direction substantially parallel to a Z axis (hereinafter, a Z-axis direction). For example, the first support portion 301 may protrude from one side edge of the base portion 350 toward one side edge of the window 700.

The second support portion 302 of the frame 300 protrudes from the first support portion 301. The second support portion 302 may protrude from the first support portion 301 in a direction substantially parallel to an X axis (hereinafter, an X-axis direction). For example, the second support portion 302 may protrude from the first support portion 301 toward the fourth support portion 304. An angle between the first support portion 301 and the second support portion 302 may be a right angle.

A portion of the second support portion 302 of the frame 300 may be rounded. For example, a portion of the second support portion 302 corresponding to one side edge of the bracket 400 may be rounded.

The second support portion 302 of the frame 300 is disposed between an edge of the bracket 400 and the base portion 350. The second support portion 302 faces the base portion 350. For example, the second support portion 302 faces one side edge of the base portion 350. The second support portion 302 is spaced apart from the base portion 350 by a predetermined distance. A space (or a groove) 51 may be provided between the second support portion 302 and the base portion 350. The space (or the groove) 51 may allow the second support portion 302 to move up or down along the Z-axis. As such, when a pressure is applied to one side edge of the window 700, the pressure is delivered to the second support portion 302. In this case, since there is the space (or the groove) 51 below the second support portion 302, the second support portion 302 may be bent toward one side edge of the base portion 350. More particularly, one side of the second support portion 302 that is fastened to the first support portion 301 may function as an axis, and thus, the second support portion 302 may be pressed toward one side edge of the base portion 350. In this case, another side of the second support portion 302 may move toward one side edge of the base portion 350. When the pressure applied to the second support portion 302 is sufficiently large, another side of the second support portion 302 may contact one side edge of the base portion 350. When the pressure is removed, the second support portion 302 may return to its original position by a restoring force.

If a pressure applied to a central portion of the window 700 and a pressure applied to one side edge of the window 700 are substantially equal to each other, the magnitude of a pressure delivered to the central portion of the pressure sensing portion 500 and a pressure delivered to one side edge of the pressure sensing portion 500 may be substantially the same. This is because a deviation between the pressure delivered to one side edge of the pressure sensing portion 500 and the pressure delivered to the central portion of the pressure sensing portion 500 may be substantially lowered (or minimized) due to the space (or the groove) 51 of the frame 300 described above. If there is no space 51 between one side edge of the pressure sensing portion 500 and one side edge of the base portion 350, a pressure delivered to one side edge of the pressure sensing portion 500 and a pressure delivered to the central portion of the pressure sensing portion 500 may have a large deviation. However, according to an exemplary embodiment, the space (or the groove) 51 may be located at one side edge of the base portion 350 corresponding to one side edge of the pressure sensing portion 500, as shown in FIG. 2. In this manner, a deviation between the pressure delivered to one side edge of the pressure sensing portion 500 and the pressure delivered to the central portion of the pressure sensing portion 500 may be substantially reduced (or minimized).

The third support portion 303 of the frame 300 protrudes from the base portion 350. For example, the third support portion 303 protrudes from another side edge of the base portion 350. In such an exemplary embodiment, the third support portion 303 may protrude in the Z-axis direction from another side edge of the base portion 350. For example, the third support portion 303 may protrude from another side edge of the base portion 350 toward another side edge of the window 700.

The fourth support portion 304 of the frame 300 protrudes from the third support portion 303. In such an exemplary embodiment, the fourth support portion 304 may protrude from the third support portion 303 in a direction opposite to the X-axis direction (hereinafter, a −X-axis direction). For example, the fourth support portion 304 may protrude from the third support portion 303 toward the second support portion 302. An angle between the third support portion 303 and the fourth support portion 304 may be a right angle.

A portion of the fourth support portion 304 of the frame 300 may be rounded. For example, a portion of the fourth support portion 304 corresponding to one side edge of the bracket 400 may be rounded.

The fourth support portion 304 of the frame 300 is disposed between an edge of the bracket 400 and the base portion 350. The fourth support portion 304 faces the base portion 350. The fourth support portion 304 is spaced apart from the base portion 350 by a predetermined distance. A space (or a groove) 52 may be provided between the fourth support portion 304 and the base portion 350. The space (or the groove) 52 may allow the fourth support portion 304 to move up or down along the Z-axis. As such, when a pressure is applied to another side edge of the window 700, the pressure is delivered to the fourth support portion 304. In this case, since there is the space (or the groove) 52 below the fourth support portion 304, the fourth support portion 304 may be bent toward another side edge of the base portion 350. More particularly, one side of the fourth support portion 304 that is fastened to the third support portion 303 may function as an axis, and thus, the fourth support portion 304 may be pressed toward another side edge of the base portion 350. In this case, another side of the fourth support portion 304 may move toward another side edge of the base portion 350. When the pressure applied to the fourth support portion 304 is sufficiently large, another side of the fourth support portion 304 may contact another side edge of the base portion 350. When the pressure is removed, the fourth support portion 304 may return to its original position by a restoring force.

If a pressure applied to the central portion of the window 700 and a pressure applied to another side edge of the window 700 are substantially equal to each other, the magnitude of a pressure delivered to the central portion of the pressure sensing portion 500 and a pressure delivered to another side edge of the pressure sensing portion 500 may be substantially the same. This is because a deviation between the pressure delivered to another side edge of the pressure sensing portion 500 and the pressure delivered to the central portion of the pressure sensing portion 500 may be substantially lowered (or minimized) due to the space (or the groove) 52 of the frame 300 described above. If there is no space 52 between another side edge of the pressure sensing portion 500 and another side edge of the base portion 350, a pressure delivered to another side edge of the pressure sensing portion 500 and a pressure delivered to the central portion of the pressure sensing portion 500 may have a large deviation. However, according to an exemplary embodiment, the space (or the groove) 52 may be located at another side edge of the base portion 350 corresponding to another side edge of the pressure sensing portion 500, as shown in FIG. 2. In this manner, a deviation between the pressure delivered to another side edge of the pressure sensing portion 500 and the pressure delivered to the central portion of the pressure sensing portion 500 may be substantially reduced (or minimized).

The bracket 400 supports the pressure sensing portion 500. The bracket 400 may include curved portions at opposite edges thereof. More particularly, opposite edges of the bracket 400 facing each other may be curved. A portion disposed between the opposite curved edges of the bracket 400 (hereinafter, a central portion) may be flat.

One side edge of the bracket 400 is disposed on the second support portion 302 of the frame 300. For example, one side edge of the bracket 400 may be disposed between the second support portion 302 and one side edge of the pressure sensing portion 500. One side edge of the bracket 400 is supported by the second support portion 302.

Another side edge of the bracket 400 is disposed on the fourth support portion 304 of the frame 300. For example, another side edge of the bracket 400 may be disposed between the fourth support portion 304 and another side edge of the pressure sensing portion 500. Another side edge of the bracket 400 is supported by the fourth support portion 304.

The central portion of the bracket 400 may be disposed between the central portion of the base portion 350 and the central portion of the pressure sensing portion 500. The central portion of the bracket 400 is spaced apart from the central portion of the base portion 350 by a predetermined distance. A space may be provided between the central portion of the bracket 400 and the central portion of the base portion 350.

The pressure sensing portion 500 senses a pressure applied to the window 700. The pressure sensing portion 500 senses the pressure to determine whether a touch has occurred.

The pressure sensing portion 500 may include at least one pressure sensing element. When a touch occurs, the pressure sensing element may sense the pressure from the touch and generate a sensing signal in response to the sensing. For example, when a pressure greater than a predetermined threshold is applied, the pressure sensing element may generate the sensing signal. The pressure sensing element may be a force sensor, for example.

The sensing signal generated from the pressure sensing element may be applied to a touch controller of the circuit board 200. The touch controller may calculate coordinates of the touch based on the sensing signal, and may provide information related to the coordinates to the timing controller. The timing control may correct an image data signal based on the coordinate information.

The pressure sensing portion 500 is disposed between the bracket 400 and the display panel 600. The pressure sensing portion 500 may include curved portions at opposite edges thereof. More particularly, opposite edges of the pressure sensing portion 500 facing each other may be curved. A portion (hereinafter, a central portion) disposed between the curved opposite edges of the pressure sensing portion 500 may be flat.

One side edge of the pressure sensing portion 500 is disposed on one side edge of the bracket 400. For example, one side edge of the pressure sensing portion 500 may be disposed between one side edge of the bracket 400 and one side edge of the display panel 600.

Another side edge of the pressure sensing portion 500 is disposed on another side edge of the bracket 400. For example, another side edge of the pressure sensing portion 500 may be disposed between another side edge of the bracket 400 and another side edge of the display panel 600.

The central portion of the pressure sensing portion 500 is disposed on the central portion of the bracket 400. For example, the central portion of the pressure sensing portion 500 may be disposed between the central portion of the bracket 400 and a central portion of the display panel 600.

The display panel 600 may display images. The display panel 600 includes a plurality of gate lines and a plurality of data lines. In addition, the display panel 600 may include liquid crystals or a light emitting diode.

The display panel 600 includes a display area and a non-display area, and the image is displayed in the display area. A gate driver and a data driver may be located in the non-display area. The gate driver drives the gate lines of the display panel 600, and the data driver drives the data lines of the display panel 600. In an exemplary embodiment, at least a portion of the data driver may be disposed on the circuit board 200. Alternatively, the data driver may be connected between the circuit board 200 and the display panel 600. The data driver may convert an image data signal provided from the timing controller into an analog signal, and provide the converted analog signal to the data lines of the display panel 600.

The display panel 600 is disposed between the pressure sensing portion 500 and the window 700. The display panel 600 may include curved portions at opposite edges thereof. In particular, opposite edges of the display panel 600 facing each other may be curved. A portion disposed between the curved opposite edges of the display panel 600 (hereinafter, a central portion) may be flat.

One side edge of the display panel 600 is disposed on one side edge of the pressure sensing portion 500. For example, one side edge of the display panel 600 is disposed between one side edge of the pressure sensing portion 500 and one side edge of the window 700.

Another side edge of the display panel 600 is disposed on another side edge of the pressure sensing portion 500. For example, another side edge of the display panel 600 is disposed between another side edge of the pressure sensing portion 500 and another side edge of the window 700.

The central portion of the display panel 600 is disposed on the central portion of the pressure sensing portion 500. For example, the central portion of the display panel 600 is disposed between the central portion of the pressure sensing portion 500 and the central portion of the window 700.

The window 700 includes a transparent glass material. The window 700 may include a transmissive area and a light blocking area. A light blocking material may be disposed in the light blocking area of the window 700. The light blocking material may be attached to the light blocking area via a printing method. In this case, the light blocking material may be disposed between the window 700 and the display panel 600.

The window 700 is disposed on the display panel 600. The window 700 may have opposing edges that are curved. In particular, opposite edges of the window 700 facing each other may be curved. A portion disposed between the curved opposite edges of the window 700 (hereinafter, a central portion) may be flat.

One side edge of the window 700 is disposed on one side edge of the display panel 600, and another side edge of the window 700 is disposed on another side edge of the display panel 600. The central portion of the window 700 is disposed on the central portion of the display panel 600.

As illustrated in FIGS. 1 and 2, the display device according to an exemplary embodiment may further include a first tape 801, a second tape 802, a third tape 803, and a fourth tape 804. Each of the first, second, third, and fourth tapes 801, 802, 803, and 804 may be a double-sided tape.

The first tape 801 may be disposed between one side edge of the bottom cover 100 and one side edge of the base portion 350. The first tape 801 is bonded to one side edge of the bottom cover 100 and one side edge of the base portion 350. In this case, as illustrated in FIGS. 1 and 2, the bottom cover 100 may have a groove into which the first tape 801 is inserted. Alternatively, the groove in the bottom cover 100 may be omitted.

The second tape 802 is disposed between the first support portion 301 and the window 700, between the first support portion 301 and the display panel 600, between the first support portion 301 and the pressure sensing portion 500, and between the second support portion 302 and the bracket 400. The second tape 802 is bonded to the third support portion 303, the window 700, the display panel 600, the pressure sensing portion 500, the fourth support portion 304, and the bracket 400.

The third tape 803 may be disposed between another side edge of the bottom cover 100 and another side edge of the base portion 350. The third tape 803 is bonded to another side edge of the bottom cover 100 and another side edge of the base portion 350. In this case, as illustrated in FIGS. 1 and 2, the bottom cover 100 may have a groove into which the third tape 803 is inserted. Alternatively, the groove in the bottom cover 100 may be omitted.

The fourth tape 804 is disposed between the third support portion 303 and the window 700, between the third support portion 303 and the display panel 600, between the third support portion 303 and the pressure sensing portion 500, and between the fourth support portion 304 and the bracket 400. The fourth tape 804 is bonded to the third support portion 303, the window 700, the display panel 600, the pressure sensing portion 500, the fourth support portion 304, and the bracket 400.

Figure 3:
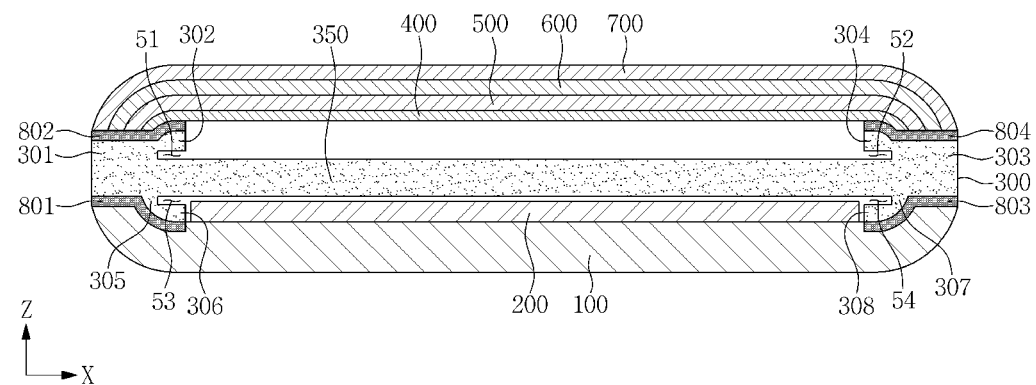
FIG. 3 is a cross-sectional view taken along line I-I' of FIG. 1 according to another exemplary embodiment.

FIG. 3 is a cross-sectional view taken along line I-I' of FIG. 1 according to another exemplary embodiment.

As illustrated in FIG. 3, a frame 300 may include a base portion 350, a first support portion 301, a second support portion 302, a third support portion 303, a fourth support portion 304, a fifth support portion 305, a sixth support portion 306, a seventh support portion 307, and an eighth support portion 308.

The first support portion 301, the second support portion 302, the third support portion 303, and the fourth support portion 304 of FIG. 3 are substantially identical to the first support portion 301, the second support portion 302, the third support portion 303, and the fourth support portion 304 of FIG. 1 described above, respectively.

The fifth support portion 305 of the frame 300 protrudes from the base portion 350. For example, the fifth support portion 305 protrudes from one side edge of the base portion 350. In such an exemplary embodiment, the fifth support portion 305 may protrude from one side edge of the base portion 350 in a direction opposite to the Z-axis direction (hereinafter, a −Z-axis direction). For example, the fifth support portion 305 may protrude from one side edge of the base portion 350 toward one side edge of the bottom cover 100.

The sixth support portion 306 of the frame 300 protrudes from the fifth support portion 305. In such an exemplary embodiment, the sixth support portion 306 may protrude from the fifth support portion 305 in the X-axis direction. For example, the sixth support portion 306 may protrude from the fifth support portion 305 toward the eighth support portion 308. An angle formed between the fifth support portion 305 and the sixth support portion 306 may be a right angle.

A portion of the sixth support portion 306 of the frame 300 may be rounded. For example, a portion of the sixth support portion 306 corresponding to one side edge of the bottom cover 100 may be rounded.

The sixth support portion 306 of the frame 300 is disposed between one side edge of the bottom cover 100 and one side edge of the base portion 350. The sixth support portion 306 faces the base portion 350. For example, the sixth support portion 306 faces one side edge of the base portion 350. The sixth support portion 306 is spaced apart from the base portion 350 by a predetermined distance. A space (or a groove) 53 may be provided between the sixth support portion 306 and the base portion 350. The space (or the groove) 53 may allow the sixth support portion 306 to move up or down along the Z-axis. More particularly, when a pressure is applied to one side edge of the window 700, the pressure is delivered to the sixth support portion 306. As such, since there is the space (or the groove) 53 above the sixth support portion 306, the sixth support portion 306 may be bent toward one side edge of the base portion 350. More particularly, one side of the sixth support portion 306 that is fastened to the fifth support portion 305 may function as an axis, and thus, the sixth support portion 306 may be pressed toward one side edge of the base portion 350. In this case, another side of the sixth support portion 306 may move toward one side edge of the base portion 350. When the pressure applied to the sixth support portion 306 is sufficiently large, another side of the sixth support portion 306 may contact one side edge of the base portion 350. When the pressure is removed, the sixth support portion 306 may return to its original position by a restoring force.

The seventh support portion 307 of the frame 300 protrudes from the base portion 350. In particular, the seventh support portion 307 protrudes from another side edge of the base portion 350. In such an exemplary embodiment, the seventh support portion 307 may protrude from another side edge of the base portion 350 in the −Z-axis direction. For example, the seventh support portion 307 may protrude from another side edge of the base portion 350 toward another side edge of the bottom cover 100.

The eighth support portion 308 of the frame 300 protrudes from the seventh support portion 307. In such an exemplary embodiment, the eighth support portion 308 may protrude from the seventh support portion 307 in the −X-axis direction. For example, the eighth support portion 308 may protrude from the seventh support portion 307 toward the sixth support portion 306. An angle between the seventh support portion 307 and the eighth support portion 308 may be a right angle.

A portion of the eighth support portion 308 of the frame 300 may be rounded. For example, a portion of the eighth support portion 308 corresponding to another side edge of the bottom cover 100 may be rounded.

The eighth support portion 308 of the frame 300 is disposed between another side edge of the bottom cover 100 and another side edge of the base portion 350. The eighth support portion 308 faces the base portion 350. For example, the eighth support portion 308 faces another side edge of the base portion 350. The eighth support portion 308 is spaced apart from the base portion 350 by a predetermined distance. A space (or a groove) 54 may be provided between the eighth support portion 308 and the base portion 350. The space (or the groove) 54 may allow the eighth support portion 308 to move up or down along the Z-axis. As such, when a pressure is applied to another side edge of the window 700, the pressure is delivered to the eighth support portion 308. In this case, since there is the space (or the groove) 54 above the eighth support portion 308, the eighth support portion 308 may be bent toward another side edge of the base portion 350. More particularly, one side of the eighth support portion 308 that is fastened to the seventh support portion 307 may function as an axis, and thus, the eighth support portion 308 may be pressed toward another side edge of the base portion 350. In this case, another side of the eighth support portion 308 may move toward another side edge of the base portion 350. When the pressure applied to the eighth support portion 308 is sufficiently large, another side of the eighth support portion 308 may contact another side edge of the base portion 350. When the pressure is removed, the eighth support portion 308 may return to its original position by a restoring force.

The bottom cover 100, the circuit board 200, the bracket 400, the pressure sensing portion 500, the display panel 600, the window 700, the first tape 801, the second tape 802, the third tape 803, and the fourth tape 804 of FIG. 3 are substantially identical to the bottom cover 100, the circuit board 200, the bracket 400, the pressure sensing portion 500, the display panel 600, the window 700, the first tape 801, the second tape 802, the third tape 803, and the fourth tape 804 of FIG. 1 described above, respectively.

Figure 4:
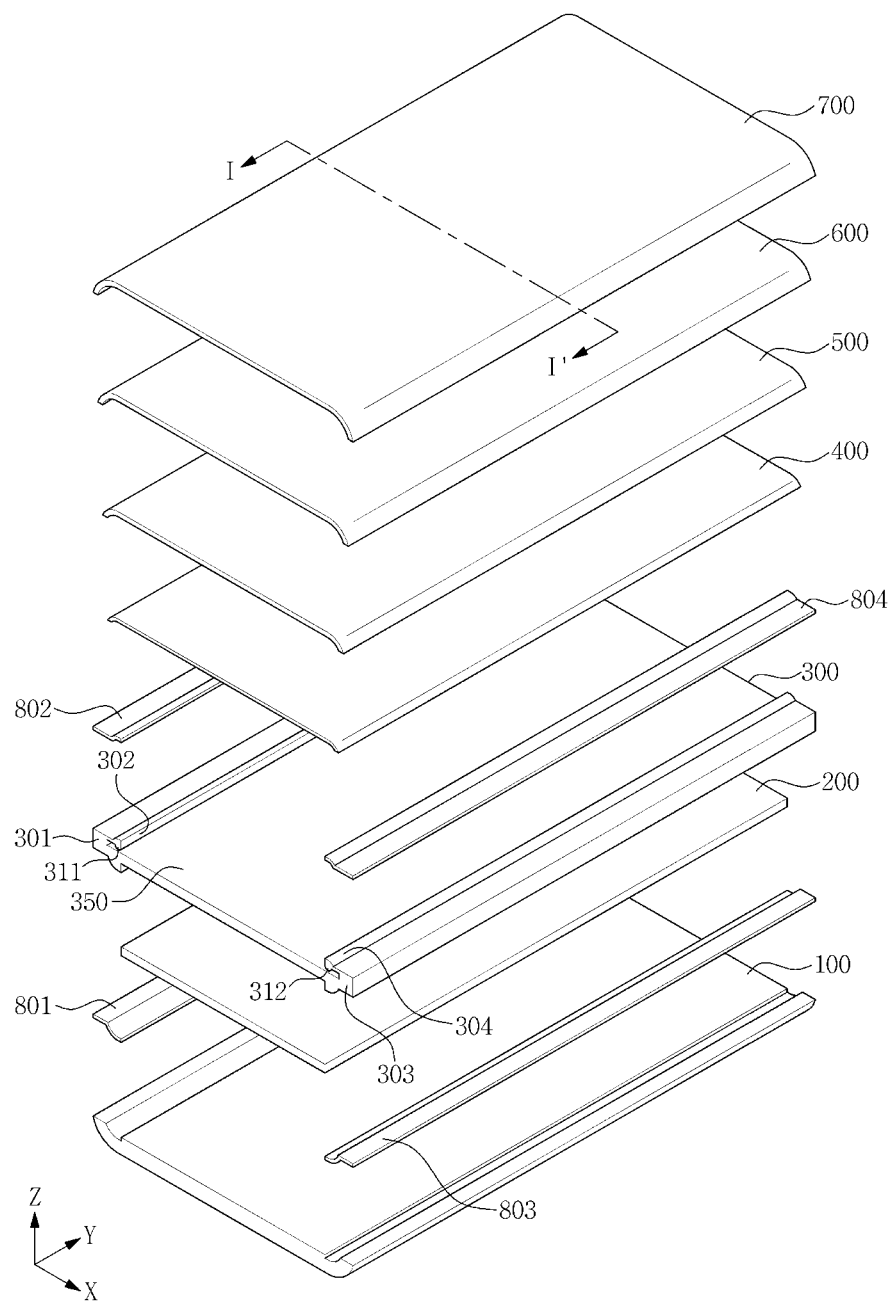
FIG. 4 is an exploded perspective view illustrating a display device according to another exemplary embodiment.
Figure 5:
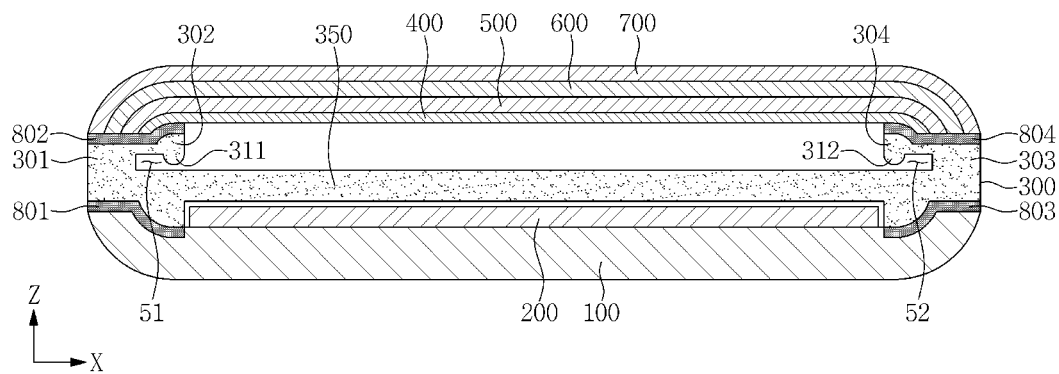
FIG. 5 is a cross-sectional view taken along line I-I' of FIG. 4 according to an exemplary embodiment.

FIG. 4 is an exploded perspective view illustrating a display device according to an exemplary embodiment, and FIG. 5 is a cross-sectional view taken along line I-I' of FIG. 4.

As illustrated in FIGS. 4 and 5, the display device according to an exemplary embodiment includes a bottom cover 100, a circuit board 200, a frame 300, a bracket 400, a pressure sensing portion 500, a display panel 600, a window 700, a first tape 801, a second tape 802, a third tape 803, and a fourth tape 804.

The frame 300 of FIG. 4 may include a base portion 350, a first support portion 301, a second support portion 302, a third support portion 303, a fourth support portion 304, a first protrusion portion 311, and a second protrusion portion 312.

The first protrusion portion 311 protrudes from the second support portion 302. For example, the first protrusion portion 311 may protrude from the second support portion 302 in the −Z-axis direction. For example, the first protrusion portion 311 may protrude from the second support portion 302 toward one side edge of the base portion 350. The first protrusion portion 311 is disposed between the second support portion 302 and one side edge of the base portion 350.

The second protrusion portion 312 protrudes from the fourth support portion 304. For example, the second protrusion portion 312 may protrude from the fourth support portion 304 in the −Z-axis direction. For example, the second protrusion portion 312 may protrude from the fourth support portion 304 toward another side edge of the base portion 350. The second protrusion portion 312 is disposed between the fourth support portion 304 and another side edge of the base portion 350.

The base portion 350, the first support portion 301, the second support portion 302, the third support portion 303, and the fourth support portion 304 of FIG. 4 are substantially identical to the base portion 350, the first support portion 301, the second support portion 302, the third support portion 303, and the fourth support portion 304 of FIG. 1 described above, respectively.

The bottom cover 100, the circuit board 200, the bracket 400, the pressure sensing portion 500, the display panel 600, the window 700, the first tape 801, the second tape 802, the third tape 803, and the fourth tape 804 of FIG. 4 are substantially identical to the bottom cover 100, the circuit board 200, the bracket 400, the pressure sensing portion 500, the display panel 600, the window 700, the first tape 801, the second tape 802, the third tape 803, and the fourth tape 804 of FIG. 1 described above, respectively.

Figure 6:
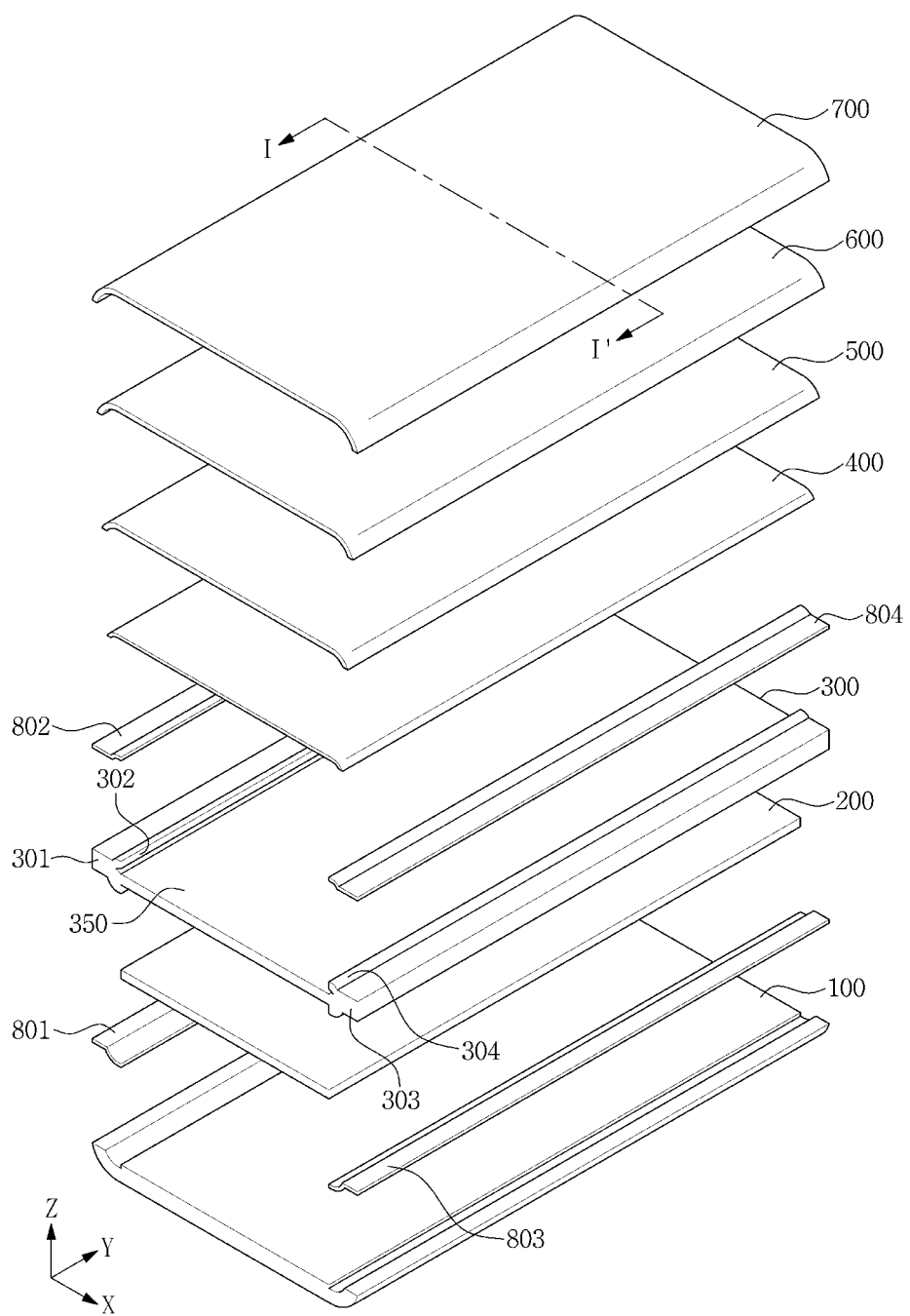
FIG. 6 is an exploded perspective view illustrating a display device according to still another exemplary embodiment.
Figure 7:
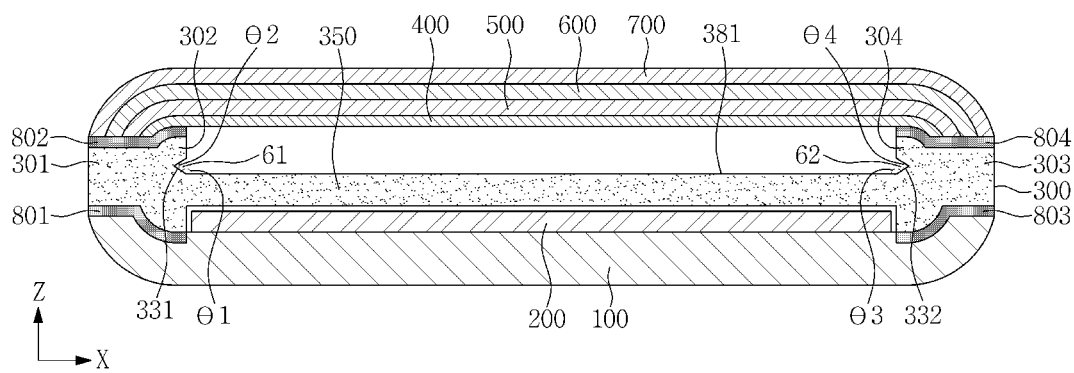
FIG. 7 is a cross-sectional view taken along line I-I' of FIG. 6 according to an exemplary embodiment.

FIG. 6 is an exploded perspective view illustrating a display device according to an exemplary embodiment, and FIG. 7 is a cross-sectional view taken along line I-I' of FIG. 6.

As illustrated in FIGS. 6 and 7, the display device according to an exemplary embodiment includes a bottom cover 100, a circuit board 200, a frame 300, a bracket 400, a pressure sensing portion 500, a display panel 600, a window 700, a first tape 801, a second tape 802, a third tape 803, and a fourth tape 804.

The frame 300 of FIG. 6 may include a base portion 350, a first support portion 301, a second support portion 302, a third support portion 303, and a fourth support portion 304.

The first support portion 301 of the frame 300 protrudes from the base portion 350. In particular, the first support portion 301 protrudes from one side edge of the base portion 350 in the Z-axis direction from one side edge of the base portion 350. For example, the first support portion 301 may protrude from one side edge of the base portion 350 toward one side edge of the window 700. The first support portion 301 includes at least one inclined surface 331. For example, when surfaces of the first support portion 301 and the third support portion 303 facing each other are defined as inner side surfaces of the respective support portions, the inner side surface of the first support portion 301 corresponds to the inclined surface 331. An angle θ1 between the inclined surface 331 of the first support portion 301 and a first surface 381 of the base portion 350 may be an obtuse angle. The first surface 381 of the base portion 350 may refer to one of the surfaces of the base portion 350 that faces the bracket 400. The inclined surface 331 of the first support portion 301 is disposed adjacent to the first surface 381 of the base portion 350.

The second support portion 302 of the frame 300 protrudes from the inclined surface 331 of the first support portion 301. In such an exemplary embodiment, the second support portion 302 may protrude from the first support portion 301 in a diagonal direction between the X-axis direction and the Z-axis direction. For example, the second support portion 302 may protrude from the inclined surface 331 of the first support portion 301 in a direction perpendicular to the inclined surface 331. An angle θ2 between the first support portion 301 and the second support portion 302 may be an acute angle.

A portion of the second support portion 302 of the frame 300 may be rounded. For example, a portion of the fourth support portion 304 corresponding to one side edge of the bracket 400 may be rounded.

The second support portion 302 of the frame 300 is disposed between an edge of the bracket 400 and the base portion 350. The second support portion 302 faces the base portion 350. For example, the second support portion 302 faces one side edge of the base portion 350. The second support portion 302 is spaced apart from the base portion 350 by a predetermined distance. A space (or a groove) 61 may be provided between the second support portion 302 and the base portion 350. The space (or the groove) 61 may allow the second support portion 302 to move up or down along the Z-axis. As such, when a pressure is applied to one side edge of the window 700, the pressure is delivered to the second support portion 302. In this case, since there is the space (or the groove) 61 below the second support portion 302, the second support portion 302 may be bent toward one side edge of the base portion 350. More particularly, one side of the second support portion 302 that is fastened to the first support portion 301 may function as an axis, and thus, the second support portion 302 may be pressed toward one side edge of the base portion 350. In this case, another side of the second support portion 302 may move toward one side edge of the base portion 350. When the pressure applied to the second support portion 302 is sufficiently large, another side of the second support portion 302 may contact one side edge of the base portion 350. When the pressure is removed, the second support portion 302 may return to its original position by a restoring force.

The third support portion 303 of the frame 300 protrudes from the base portion 350. For example, the third support portion 303 protrudes from another side edge of the base portion 350. In such an exemplary embodiment, the third support portion 303 may protrude in the Z-axis direction from another side edge of the base portion 350. For example, the third support portion 303 may protrude from another side edge of the base portion 350 toward another side edge of the window 700. The third support portion 303 includes at least one inclined surface 332. For example, when surfaces of the third support portion 303 and the first support portion 301 facing each other are defined as inner side surfaces of the respective support portions, the inner side surface of the third support portion 303 corresponds to the inclined surface 332. An angle θ3 between the inclined surface 332 of the third support portion 303 and the first surface 381 of the base portion 350 may be an obtuse angle. The inclined surface 332 of the third support portion 303 is disposed adjacent to the first surface 381 of the base portion 350.

The fourth support portion 304 of the frame 300 protrudes from the inclined surface 332 of the third support portion 303. In such an exemplary embodiment, the fourth support portion 304 may protrude from the third support portion 303 in a diagonal direction between the −X-axis direction and the Z-axis direction. For example, the fourth support portion 304 may protrude from the inclined surface 332 of the third support portion 303 in a direction perpendicular to the inclined surface 332. An angle θ4 between the third support portion 303 and the fourth support portion 304 may be an acute angle.

A portion of the fourth support portion 304 of the frame 300 may be rounded. For example, a portion of the fourth support portion 304 corresponding to another side edge of the bracket 400 may be rounded.

The fourth support portion 304 of the frame 300 is disposed between an edge of the bracket 400 and the base portion 350. The fourth support portion 304 faces the base portion 350. For example, the fourth support portion 304 faces another side edge of the base portion 350. The fourth support portion 304 is spaced apart from the base portion 350 by a predetermined distance. A space (or a groove) 62 may be provided between the fourth support portion 304 and the base portion 350. The space (or the groove) 62 may allow the fourth support portion 304 to move up or down along the Z-axis. As such, when a pressure is applied to another side edge of the window 700, the pressure is delivered to the fourth support portion 304. In this case, since there is the space (or the groove) 62 below the fourth support portion 304, the fourth support portion 304 may be bent toward another side edge of the base portion 350. In particular, one side of the fourth support portion 304 that is fastened to the third support portion 303 may function as an axis, and thus, the fourth support portion 304 may be pressed toward another side edge of the base portion 350. In this case, another side of the fourth support portion 304 may move toward another side edge of the base portion 350. When the pressure applied to the fourth support portion 304 is sufficiently large, another side of the fourth support portion 304 may contact another side edge of the base portion 350. When the pressure is removed, the fourth support portion 304 may return to its original position by a restoring force.

The base portion 350, the bottom cover 100, the circuit board 200, the bracket 400, the pressure sensing portion 500, the display panel 600, the window 700, the first tape 801, the second tape 802, the third tape 803, and the fourth tape 804 of FIG. 6 are substantially identical to the base portion 350, the bottom cover 100, the circuit board 200, the bracket 400, the pressure sensing portion 500, the display panel 600, the window 700, the first tape 801, the second tape 802, the third tape 803, and the fourth tape 804 of FIG. 1 described above, respectively.

Figure 8:
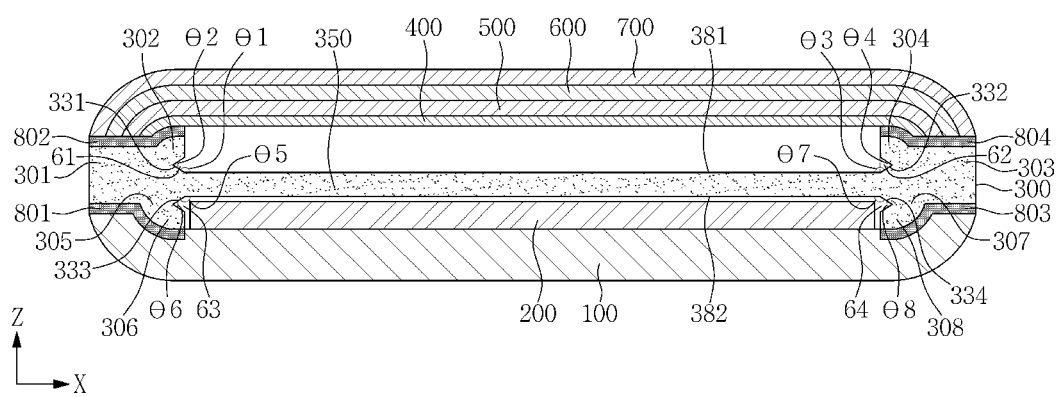
FIG. 8 is a cross-sectional view taken along line I-I' of FIG. 6 according to another exemplary embodiment.

FIG. 8 is a cross-sectional view taken along line I-I' of FIG. 6 according to another exemplary embodiment.

As illustrated in FIG. 8, the frame 300 may include a base portion 350, a first support portion 301, a second support portion 302, a third support portion 303, a fourth support portion 304, a fifth support portion 305, a sixth support portion 306, a seventh support portion 307, and an eighth support portion 308.

The first support portion 301, the second support portion 302, the third support portion 303, and the fourth support portion 304 of FIG. 8 are substantially identical to the first support portion 301, the second support portion 302, the third support portion 303, and the fourth support portion 304 of FIG. 6 described above, respectively.

The fifth support portion 305 of the frame 300 protrudes from the base portion 350. In particular, the fifth support portion 305 protrudes from one side edge of the base portion 350 in the −Z-axis direction. For example, the fifth support portion 305 may protrude from one side edge of the base portion 350 toward one side edge of the bottom cover 100. The fifth support portion 305 includes at least one inclined surface 333. For example, when surfaces of the fifth support portion 305 and the seventh support portion 307 facing each other are defined as inner side surfaces of the respective support portions, the inner side surface of the fifth support portion 305 corresponds to the inclined surface 333. An angle θ5 between the inclined surface 333 of the fifth support portion 305 and a second surface 382 of the base portion 350 may be an obtuse angle. The second surface 382 of the base portion 350 may be one of the surfaces of the base portion 350 that faces the bottom cover 100 (or the circuit board 200). The inclined surface 333 of the fifth support portion 305 is disposed adjacent to the second surface 382 of the base portion 350.

The sixth support portion 306 of the frame 300 protrudes from the inclined surface 333 of the fifth support portion 305. The sixth support portion 306 may protrude from the fifth support portion 305 in a diagonal direction between the X-axis direction and the −Z-axis direction. For example, the sixth support portion 306 may protrude from the inclined surface 333 of the fifth support portion 305 in a direction perpendicular to the inclined surface 333. An angle θ6 between the fifth support portion 305 and the sixth support portion 306 may be an acute angle.

A portion of the sixth support portion 306 of the frame 300 may be rounded. For example, a portion of the sixth support portion 306 corresponding to one side edge of the bracket 400 may be rounded.

The sixth support portion 306 of the frame 300 is disposed between one side edge of the bottom cover 100 and one side edge of the base portion 350. The sixth support portion 306 faces the base portion 350. For example, the sixth support portion 306 faces one side edge of the base portion 350. The sixth support portion 306 is spaced apart from the base portion 350 by a predetermined distance. A space (or a groove) 63 may be provided between the sixth support portion 306 and the base portion 350. The space (or the groove) 63 may allow the sixth support portion 306 to move up or down along the Z-axis. As such, when a pressure is applied to one side edge of the window 700, the pressure is delivered to the sixth support portion 306. In this case, since there is the space (or the groove) 63 above the sixth support portion 306, the sixth support portion 306 may be bent toward one side edge of the base portion 350. In particular, one side of the sixth support portion 306 that is fastened to the fifth support portion 305 may function as an axis, and thus, the sixth support portion 306 may be pressed toward one side edge of the base portion 350. In this case, another side of the sixth support portion 306 may move toward one side edge of the base portion 350. When the pressure applied to the sixth support portion 306 is sufficiently large, another side of the sixth support portion 306 may contact one side edge of the base portion 350. When the pressure is removed, the sixth support portion 306 may return to its original position by a restoring force.

The seventh support portion 307 of the frame 300 protrudes from the base portion 350. In particular, the seventh support portion 307 protrudes from another side edge of the base portion 350. In such an exemplary embodiment, the seventh support portion 307 may protrude in the −Z-axis direction from another side edge of the base portion 350. For example, the seventh support portion 307 may protrude from another side edge of the base portion 350 toward another side edge of the bottom cover 100. The seventh support portion 307 includes at least one inclined surface 334. For example, when surfaces of the seventh support portion 307 and the fifth support portion 305 that face each other are defined as inner side surfaces of the respective support portions, the inner side surface of the seventh support portion 307 corresponds to the inclined surface 334. An angle θ7 between the inclined surface 334 of the seventh support portion 307 and the second surface 382 of the base portion 350 may be an obtuse angle. The inclined surface 334 of the seventh support portion 307 is disposed adjacent to the second surface 382 of the base portion 350.

The eighth support portion 308 of the frame 300 protrudes from the inclined surface 334 of the seventh support portion 307. In such an exemplary embodiment, the eighth support portion 308 may protrude from the seventh support portion 307 in a diagonal direction between the −X-axis direction and the −Z-axis direction. For example, the eighth support portion 308 may protrude from the inclined surface 334 of the seventh support portion 307 in a direction perpendicular to the inclined surface 334. An angle θ8 between the seventh support portion 307 and the eighth support portion 308 may be an acute angle.

A portion of the eighth support portion 308 of the frame 300 may be rounded. For example, a portion of the eighth support portion 308 corresponding to another side edge of the bottom cover 100 may be rounded.

The eighth support portion 308 of the frame 300 is disposed between another side edge of the bottom cover 100 and another side edge of the base portion 350. The eighth support portion 308 faces the base portion 350. For example, the eighth support portion 308 faces another side edge of the base portion 350. The eighth support portion 308 is spaced apart from the base portion 350 by a predetermined distance. A space (or a groove) 64 may be provided between the eighth support portion 308 and the base portion 350. The space (or the groove) 64 may allow the eighth support portion 308 to move up or down along the Z-axis. As such, when a pressure is applied to another side edge of the window 700, the pressure is delivered to the eighth support portion 308. In particular, since there is the space (or the groove) 64 above the eighth support portion 308, the eighth support portion 308 may be bent toward another side edge of the base portion 350. In this case, one side of the eighth support portion 308 that is fastened to the seventh support portion 307 may function as an axis, and thus, the eighth support portion 308 may be pressed toward another side edge of the base portion 350. In this case, another side of the eighth support portion 308 may move toward another side edge of the base portion 350.

When the pressure applied to the eighth support portion 308 is sufficiently large, another side of the eighth support portion 308 may contact another side edge of the base portion 350. When the pressure is removed, the eighth support portion 308 may return to its original position by a restoring force.

The base portion 350, the bottom cover 100, the circuit board 200, the bracket 400, the pressure sensing portion 500, the display panel 600, the window 700, the first tape 801, the second tape 802, the third tape 803, and the fourth tape 804 of FIG. 8 are substantially identical to the base portion 350, the bottom cover 100, the circuit board 200, the bracket 400, the pressure sensing portion 500, the display panel 600, the window 700, the first tape 801, the second tape 802, the third tape 803, and the fourth tape 804 of FIG. 1 described above, respectively.

Figure 9:
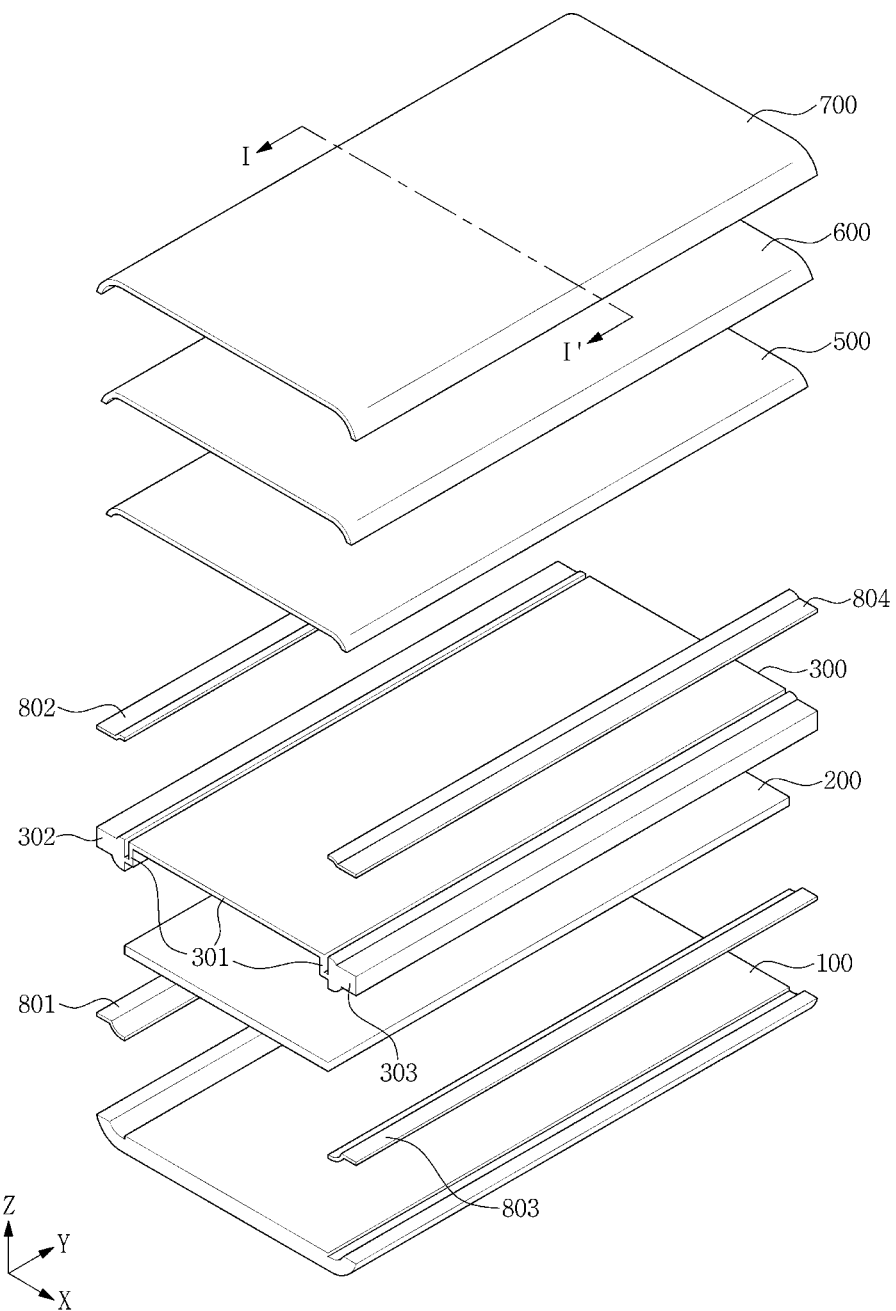
FIG. 9 is an exploded perspective view illustrating a display device according to still yet another exemplary embodiment.
Figure 10:
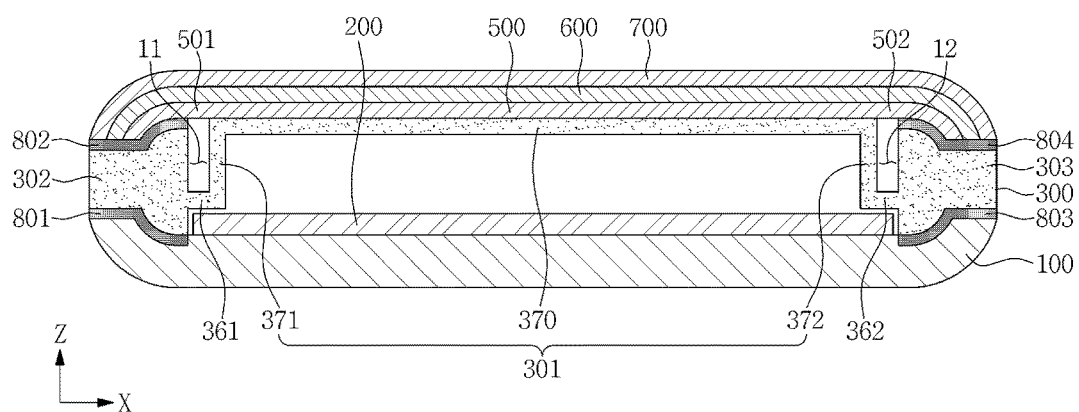
FIG. 10 is a cross-sectional view taken along line I-I' of FIG. 9 according to an exemplary embodiment.

FIG. 9 is an exploded perspective view illustrating a display device according to an exemplary embodiment, and FIG. 10 is a cross-sectional view taken along line I-I' of FIG. 9.

As illustrated in FIGS. 9 and 10, the display device according to an exemplary embodiment includes a bottom cover 100, a circuit board 200, a frame 300, a pressure sensing portion 500, a display panel 600, a window 700, a first tape 801, a second tape 802, a third tape 803, and a fourth tape 804.

The frame 300 is disposed between the bottom cover 100 and the window 700. In this case, the frame 300 is disposed on the bottom cover 100. For example, the frame 300 may be disposed on an inner side surface of the bottom cover 100.

The frame 300 includes a first support portion 301, a second support portion 302, a third support portion 303, a first connection portion 361, and a second connection portion 362.

The first support portion 301 of the frame 300 supports a central portion of the pressure sensing portion 500. The first support portion 301 is disposed between a central portion of the bottom cover 100 and the central portion of the pressure sensing portion 500. The cross-section of the first support portion 301 may be n-shaped.

The second support portion 302 of the frame 300 supports one side edge of the pressure sensing portion 500. The second support portion 302 is disposed between one side edge of the bottom cover 100 and one side edge of the pressure sensing portion 500.

The third support portion 303 of the frame 300 supports another side edge of the pressure sensing portion 500. The third support portion 303 is disposed between another side edge of the bottom cover 100 and another side edge of the pressure sensing portion 500.

The first connection portion 361 of the frame 300 connects the first support portion 301 and the second support portion 302. The first connection portion 361 is disposed between the first support portion 301 and the second support portion 302. In this case, the first connection portion 361 is spaced apart from the pressure sensing portion 500 by a predetermined distance. For example, the first connection portion 361 is spaced apart from a first intermediate portion 501 of the pressure sensing portion 500 by a predetermined distance. In this case, the first intermediate portion 501 of the pressure sensing portion 500 is disposed between one side edge of the pressure sensing portion 500 and the central portion of the pressure sensing portion 500.

The second connection portion 362 of the frame 300 connects the first support portion 301 and the third support portion 303. The second connection portion 362 is disposed between the first support portion 301 and the third support portion 303. In this case, the second connection portion 362 is spaced apart from the pressure sensing portion 500 by a predetermined distance. The second connection portion 362 is spaced apart from a second intermediate portion 502 of the pressure sensing portion 500 by a predetermined distance. In this case, the second intermediate portion 502 of the pressure sensing portion 500 is disposed between another side edge of the pressure sensing portion 500 and the central portion of the pressure sensing portion 500.

The display device of FIG. 9 has a first hole 11 surrounded by the first support portion 301, the second support portion 302, the first connection portion 361, and the pressure sensing portion 500. The first hole 11 may be located to correspond to the first intermediate portion 501 of the pressure sensing portion 500.

The display device of FIG. 9 has a second hole 12 surrounded by the first support portion 301, the third support portion 303, the second connection portion 362, and the pressure sensing portion 500. The second hole 12 is formed to correspond to the second intermediate portion 502 of the pressure sensing portion 500.

The first support portion 301 includes a support plate 370, a first column 371, and a second column 372.

The support plate 370 is disposed closer to the pressure sensing portion 500 than is to the bottom cover 100. The support plate 370 may contact the central portion of the pressure sensing portion 500.

The first column 371 and the second column 372 are disposed between the support plate 370 and the bottom cover 100. In this case, the first column 371 is disposed at one side edge of the support plate 370, and the second column 372 is disposed at another side edge of the support plate 370.

The first hole 11 is surrounded by the first column 371 of the first support portion 301, the second support portion 302, the first connection portion 361 and the first intermediate portion 501 of the pressure sensing portion 500. The second hole 12 is surrounded by the second column 372 of the first support portion 301, the third support portion 303, the second connection portion 362, and the second intermediate portion 502 of the pressure sensing portion 500.

Due to the first hole 11 and the second hole 12 of FIGS. 9 and 10, the magnitude of a pressure delivered to one side edge of the pressure sensing portion 500 and a pressure delivered to another side edge of the pressure sensing portion 500 may be substantially equal to the magnitude of a pressure delivered to the central portion of the pressure sensing portion 500.

The bottom cover 100, the circuit board 200, the pressure sensing portion 500, the display panel 600, the window 700, the first tape 801, the second tape 802, the third tape 803, and the fourth tape 804 of FIG. 9 are substantially identical to the bottom cover 100, the circuit board 200, the pressure sensing portion 500, the display panel 600, the window 700, the first tape 801, the second tape 802, the third tape 803, and the fourth tape 804 of FIG. 1 described above, respectively.

Figure 11:
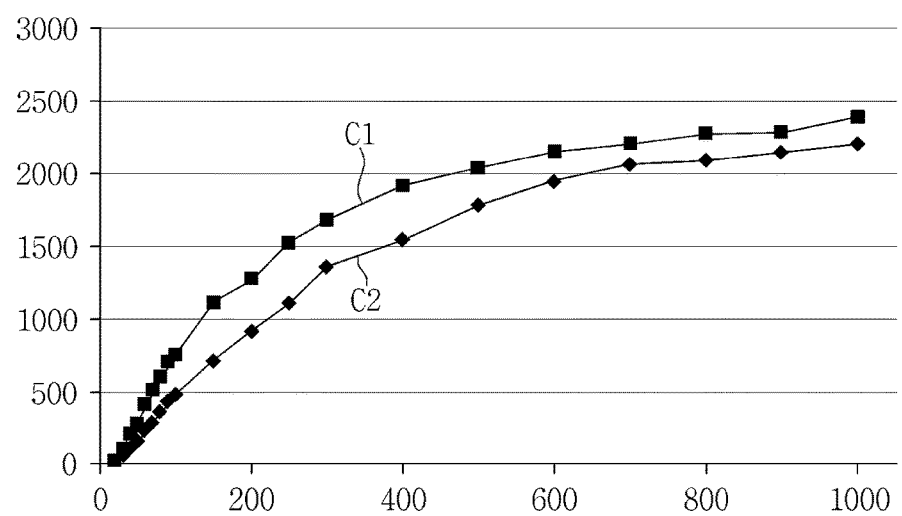
FIG. 11 is a graph illustrating the effects of a display device according to an exemplary embodiment.

FIG. 11 is a graph illustrating the effects of a display device according to exemplary embodiment.

An X-axis of FIG. 11 denotes a pressure applied to the pressure sensing portion 500, and a Y-axis denotes a sensitivity of the pressure sensing portion 500.

A first curve C1 of FIG. 11 shows a sensitivity of the pressure sensing portion 500 according to a magnitude of a pressure, when the pressure is applied to one side edge of the window 700 of the display device having the structure of FIG. 1. A second curve C2 of FIG. 11 shows a sensitivity of a pressure sensing portion 500 according to a magnitude of a pressure, when the pressure is applied to one side edge of a window 700 in a conventional display device that has no space (or groove), as described above.

As can be seen from the first curve C1 and the second curve C2 in FIG. 11, the display device according to an exemplary embodiment exhibits an improved sensitivity for an edge pressure than that in the conventional display device.

As set forth hereinabove, the display device according exemplary embodiments may provide the following effects.

The display device according to exemplary embodiments includes a frame having a groove (or a hole) at a portion corresponding to an edge of a window, which may substantially reduce (or minimize) a deviation between a pressure at an edge of a pressure sensing portion and a pressure at a central portion of the pressure sensing portion. Accordingly, the pressure sensitivity at the edge may be improved, such that the sensitivity deviation of the pressure sensing portion may be substantially reduced (or minimized).

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a bottom cover;
   a window disposed on the bottom cover;
   a frame disposed between the bottom cover and the window;
   a display panel disposed between the frame and the window;
   a bracket disposed between the display panel and the frame; and
   a pressure sensing portion disposed between the bracket and the display panel,
   wherein the frame comprises:
      a base portion disposed between the bottom cover and the bracket;
      a first support portion protruding from an edge of the base portion toward an edge of the window; and
      a second support portion protruding from the first support portion, disposed between an edge of the bracket and the base portion, and spaced apart from the base portion.

2. The display device of claim 1, wherein the frame further comprises a protrusion portion protruding from the second support portion toward the base portion.

3. The display device of claim 1, wherein:
   the first support portion comprises at least one inclined surface; and
   the second support portion protrudes from the inclined surface of the first support portion.

4. The display device of claim 3, wherein the inclined surface is adjacent to a surface of the base portion facing the bracket.

5. The display device of claim 4, wherein an angle between the inclined surface and the surface of the base portion is an obtuse angle.

6. The display device of claim 3, wherein an angle between the first support portion and the second support portion is equal to or less than a right angle.

7. The display device of claim 1, wherein the frame further comprises:
   a third support portion protruding from an edge of the base portion toward an edge of the bottom cover; and
   a fourth support portion protruding from the third support portion, disposed between the base portion and the bottom cover, and spaced apart from the base portion.

8. The display device of claim 7, wherein the edge of the base portion from which the third support portion protrudes faces the edge of the base portion from which the first support portion protrudes.

9. The display device of claim 7, wherein:
   the third support portion comprises at least one inclined surface; and
   the fourth support portion protrudes from the inclined surface of the third support portion.

10. The display device of claim 9, wherein the inclined surface is adjacent to a surface of the base portion facing the bottom cover.

11. The display device of claim 10, wherein an angle between the inclined surface and the surface of the base portion is an obtuse angle.

12. The display device of claim 9, wherein an angle between the third support portion and the fourth support portion is equal to or less than a right angle.

13. The display device of claim 1, wherein at least one of the bottom cover, the window, the pressure sensing portion, the display panel, and the bracket has a curved edge.

14. The display device of claim 1, further comprising at least one of:
- a first tape disposed between the edge of the bottom cover and the edge of the frame; and
- a second tape disposed between the first support portion and the window, between the first support portion and the display panel, between the first support portion and the pressure sensing portion, and between the second support portion and the bracket.

* * * * *